(12) United States Patent
Liu et al.

(10) Patent No.: US 9,860,978 B1
(45) Date of Patent: Jan. 2, 2018

(54) RIGID-FLEX BOARD STRUCTURE

(71) Applicant: UNIFLEX Technology Inc., Taichung (TW)

(72) Inventors: Yi-Chun Liu, New Taipei (TW); Pei-Hao Hung, Taichung (TW); Ying-Hsing Chen, Taichung (TW); Chiu-Pei Huang, Taichung (TW); Min-Ming Tsai, Taichung (TW); Shan-Yi Tseng, Taoyuan (TW); Yuan-Chih Lee, Taoyuan (TW)

(73) Assignee: UNIFLEX Technology Inc., Taichung (TW)

( * ) Notice: Subject to any disclaimer, the term of this patent is extended or adjusted under 35 U.S.C. 154(b) by 0 days.

(21) Appl. No.: 15/458,047

(22) Filed: Mar. 14, 2017

(30) Foreign Application Priority Data

Nov. 18, 2016 (TW) .............................. 105137964 A

(51) Int. Cl.
| | |
|---|---|
| *H05K 1/02* | (2006.01) |
| *H05K 1/11* | (2006.01) |
| *H05K 1/03* | (2006.01) |
| *H05K 1/05* | (2006.01) |

(52) U.S. Cl.
CPC ......... *H05K 1/0281* (2013.01); *H05K 1/0277* (2013.01); *H05K 1/115* (2013.01); *H05K 1/0306* (2013.01); *H05K 1/05* (2013.01); *H05K 2201/041* (2013.01)

(58) Field of Classification Search
CPC .... H05K 1/0277; H05K 1/0278; H05K 1/028; H05K 1/0281; H05K 1/0283
See application file for complete search history.

(56) References Cited

FOREIGN PATENT DOCUMENTS

| TW | 201031730 | 9/2010 |
|---|---|---|
| TW | I482542 | 4/2015 |
| TW | I508639 | 11/2015 |
| TW | I547216 | 8/2016 |

OTHER PUBLICATIONS

"Office Action of Taiwan Counterpart Application," dated Mar. 6, 2017, p. 1-p. 3.

*Primary Examiner* — Jeremy C Norris
(74) *Attorney, Agent, or Firm* — JCIPRNET

(57) ABSTRACT

A rigid-flex board structure includes a flexible printed circuit (FPC) board, a substrate, a reinforcing layer, a patterned circuit layer and a plurality of conductive vias. The FPC board includes at least one exposing area. The substrate is disposed on the FPC board and includes an opening exposing the exposing area. The reinforcing layer is embedded in the substrate and a rigidity of a material of the reinforcing layer is greater than a rigidity of a material of the substrate. The patterned circuit layer is disposed on the substrate. The conductive vias are configured to electrically connect the patterned circuit layer and the FPC board.

16 Claims, 3 Drawing Sheets

RIGID-FLEX BOARD STRUCTURE

CROSS-REFERENCE TO RELATED APPLICATION

This application claims the priority benefit of Taiwan application serial no. 105137964, filed on Nov. 18, 2016. The entirety of the above-mentioned patent application is hereby incorporated by reference herein and made a part of this specification.

BACKGROUND OF THE INVENTION

Field of the Invention

The invention relates to a circuit board structure and particularly relates to a rigid-flex board structure.

Description of Related Art

In terms of flexible and rigid characteristics of dielectric layers, circuit boards include rigid circuit boards (simply referred to as rigid boards), flexible circuit boards (simply referred to as flexible boards), and rigid-flexible composite circuit boards (simply referred to as rigid-flex boards). In general, a rigid-flex board is a printed circuit board comprised of a flexible circuit board and a rigid circuit board, which has both flexibility of the flexible circuit board and strength of the rigid circuit board. Under circumstances that internal space of electronic products is rapidly reduced, the rigid-flex board provides the maximum flexibility in component connection and assembly space. Thus, rigid-flex boards are often adopted as carriers for components in electronic products.

In a manufacturing method of a rigid-flex board, first, a flexible board having a circuit thereon is used as a core layer. Next a slot is formed on a rigid board by mechanical routing. Then, two (upper and lower) rigid boards are laminated together with the flexible board, such that the slot of the rigid boards exposes an exposing area of the flexible board and a rigid-flex board is thus formed. The rigid-flex board is imparted with a flexible characteristic by the exposing area.

However, in the lamination process, a substrate (semi-cured plastic material) of the rigid board is easily deformed because of pressure applied thereto, which leads to a part of the plastic material flowing into the slot of the rigid board, thus covering the exposing area of the flexible board. As a result, flexibility of the flexible board is significantly decreased, and yield rates of subsequent processes are further affected. In addition, the substrate of the rigid board has insufficient structural strength, which easily causes insufficient flatness of the rigid board, such that the rigid board cannot be closely laminated with the flexible board, and reliability of the rigid-flex board is therefore reduced.

SUMMARY OF THE INVENTION

The invention provides a rigid-flex board structure which improves flatness of a substrate and reliability of the rigid-flex board structure.

The rigid-flex board structure of the invention includes a first flexible printed circuit (FPC) board, a first substrate, a first reinforcing layer, a first patterned circuit layer, and a plurality of conductive vias. The first FPC board includes at least one first exposing area. The first substrate is disposed on the first FPC board, and includes a first opening. The first opening exposes the first exposing area. The first reinforcing layer is embedded in the first substrate and a rigidity of a material of the first reinforcing layer is substantially greater than a rigidity of a material of the first substrate. The first patterned circuit layer is disposed on the first substrate. The conductive vias are configured to electrically connect the first patterned circuit layer and the first FPC board.

In an embodiment of the invention, the aforementioned first FPC board includes at least one first flexible substrate and a plurality of first patterned metal layers. The first patterned metal layers are disposed on the first flexible substrate.

In an embodiment of the invention, the aforementioned first FPC board further includes a first coverlay (CVL), covering the first flexible substrate and the first patterned metal layers.

In an embodiment of the invention, the aforementioned first FPC board is a multilayer FPC board.

In an embodiment of the invention, the material of the aforementioned first reinforcing layer includes stainless steel or ceramic.

In an embodiment of the invention, the material of the aforementioned first substrate includes fiber glass and an insulation prepreg.

In an embodiment of the invention, the aforementioned rigid-flex board structure further includes a photo-imagable solder resist layer disposed on the first patterned circuit layer and the first substrate, and the photo-imagable solder resist layer exposes the first opening.

In an embodiment of the invention, each of the aforementioned conductive vias penetrates through the first FPC board and the first substrate.

In an embodiment of the invention, the aforementioned rigid-flex board structure further includes a second FPC board which includes a second exposing area corresponding to the first exposing area. The first FPC board and the second FPC board are respectively disposed on two opposite surfaces of the first substrate. The first opening exposes the second exposing area.

In an embodiment of the invention, each of the aforementioned conductive vias penetrates through the first FPC board, the second FPC board and the first substrate.

In an embodiment of the invention, the aforementioned rigid-flex board structure further includes a plurality of photo-imagable solder resist layers, respectively covering outer surfaces of the first FPC board and the second FPC board.

In an embodiment of the invention, the aforementioned second FPC board is a multilayer FPC board.

In an embodiment of the invention, the aforementioned second FPC board includes at least one second flexible substrate and a plurality of second patterned metal layers. The second patterned metal layers are disposed on the second flexible substrate.

In an embodiment of the invention, the aforementioned second FPC board further includes a second coverlay, covering a second flexible substrate and the second patterned metal layers.

In an embodiment of the invention, the aforementioned rigid-flex board structure further includes a second substrate and a second patterned circuit layer. The second substrate includes a second opening corresponding to the first opening. A number of the at least one first exposing area is plurality. The first substrate and the second substrate are respectively disposed on two opposite surfaces of the first FPC board, and the first opening and the second opening respectively expose the first exposing area. The conductive vias electrically connect the second patterned circuit layer with the first FPC board.

In an embodiment of the invention, the aforementioned rigid-flex board structure further includes a second reinforcing layer embedded in the second substrate. In addition, a rigidity of a material of the second reinforcing layer is substantially greater than a rigidity of a material of the second substrate.

Based on the above, in the invention, the reinforcing layer is embedded in the substrate of the rigid board in the rigid-flex board structure. Besides, the rigidity of the material of the reinforcing layer is substantially greater than the rigidity of the material of the substrate. Under such configuration, since the reinforcing layer with greater rigidity is embedded in the substrate, structural strength of the substrate can be improved and flatness of the substrate can be enhanced. The bonding strength between the substrate and the FPC board can thus be improved, and reliability of the rigid-flex board structure can also be enhanced.

To make the aforementioned features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
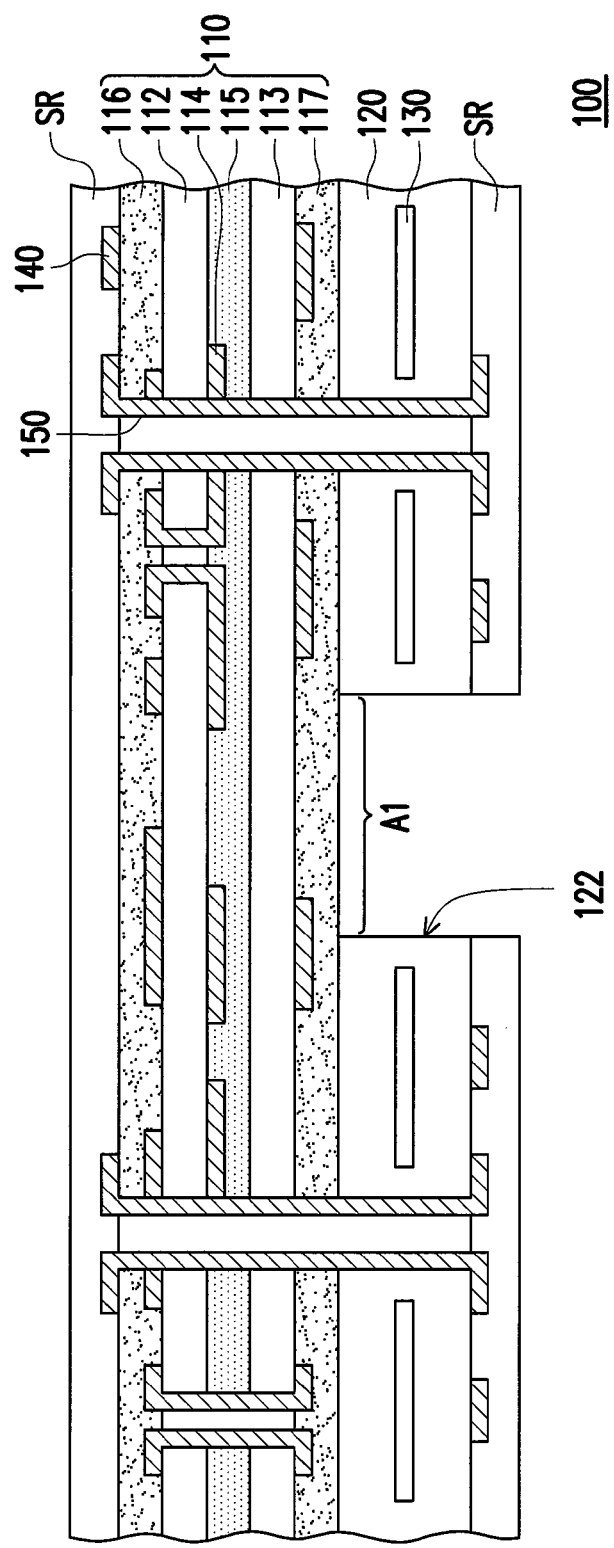
FIG. 1 is a schematic view of a rigid-flex board structure according to an embodiment of the invention.

The aforementioned and other technical contents, features, and advantages of the invention are clearly presented with the detailed descriptions of the embodiments with reference to the drawings. The directional terms referred in the following embodiments, for example, "upper," "lower," "front," "back," "left," "right," and so on refer merely to the directions of the additional drawings. Therefore, the usage of the direction terms is used to illustrate and is not used to limit the invention. In addition, in each of the following embodiment, the similar or the same reference numerals adopt the same or similar reference numerals.

FIG. 1 is a schematic view of a rigid-flex board structure according to an embodiment of the invention. Referring to FIG. 1, in this embodiment, a rigid-flex board structure 100 includes a first FPC board 110, a first substrate 120, a first reinforcing layer 130, a first patterned circuit layer 140 and a plurality of conductive vias 150. The first FPC board 110 includes at least one first exposing area A1. The first substrate 120 is disposed on the first FPC board 110 and includes a first opening 122, wherein the first opening 122 exposes the first exposing area A1. In this embodiment, the first substrate 120 can be a substrate of a general printed circuit board, a material of which includes glass fiber and/or prepreg. The present embodiment is merely for illustration purpose. The invention is not limited thereto. The material of the first substrate 120 can be any dielectric material suitable for rigid circuit boards.

In the present embodiment, the first reinforcing layer 130 is embedded in the first substrate 120. In addition, a rigidity of a material of the first reinforcing layer 130 is substantially greater than a rigidity of the material of the first substrate 120. To be more specific, the material of the first reinforcing layer 130 includes stainless steel, ceramic, or other materials having greater rigidity than the rigidity of glass fiber and/or prepreg. Under such configuration, since the first reinforcing layer 130 with greater rigidity is embedded in the first substrate 120, structural strength of the first substrate 120 can be improved and flatness of the first substrate 120 can be enhanced. A bonding strength between the first substrate 120 and the first FPC board 110 can thus be improved, and reliability of the rigid-flex board structure 100 can also be enhanced.

As described above, the first patterned circuit layer 140 is disposed on the first substrate 120, and the conductive vias 150 are configured to electrically connect the first patterned circuit layer 140 with the first FPC board 110. In detail, the conductive vias 150 can be plated through holes (PTHs), which penetrate through the first FPC board 110 and the first substrate 120 so as to electrically connect the first FPC board 110 and the first patterned circuit layer 140. It is noted that the present embodiment is merely for illustration purpose. The invention is not limited thereto. In other embodiments, in the rigid-flex board structure 100, the first FPC board 110 can also be electrically connected to the first patterned circuit layer 140 through a plurality of conductive blind via holes (BVHs) and/or buried via holes (BVHs).

In detail, the first FPC board 110 can be a single-layer FPC board or a multilayer FPC board. That is, the first FPC board 110 includes at least one first flexible substrate 112 and 113, a plurality of first patterned metal layers 114, and at least one first coverlay (CVL) 116 and 117, wherein the first patterned metal layers 114 are disposed on the first flexible substrate 112, and the first coverlay 116 covers the first flexible substrate 112 and the first patterned metal layers 114. In this embodiment, the first FPC board 110 is a multilayer FPC board, which includes the first flexible substrates 112 and 113. The first patterned metal layers 114 are respectively disposed on the first flexible substrates 112 and 113, and are electrically connected to each other via the conductive vias. The first coverlays 116 and 117 cover the first flexible substrates 112 and 113 and the first patterned metal layers 114. For example, a manufacturing method of the first FPC board 110 includes the following steps. A metal foil layer is laminated on each of two opposite surfaces of the first flexible substrate 112. Then, an electroplating process is performed to form a metal layer. The metal layer covers the aforementioned metal foil layer. Then, the metal layer is subjected to an etching process to form the first patterned metal layers 114 as shown in FIG. 1. The first FPC board 110 further includes a plurality of plated through holes, blind via holes, or buried via holes, as shown in FIG. 1, so as to be electrically connected to the first patterned metal layers 114 located on the two opposite surfaces of the first flexible substrate 112.

Based on the above, in this embodiment, another metal foil layer is further laminated on an upper surface of the first flexible substrate 113, and the metal foil layer is subjected to the aforementioned patterning process so as to form the first patterned metal layer 114 on the first flexible substrate 113. By means of an adhesive layer 115, the first flexible substrate 113 is attached to the first flexible substrate 112, so as to form the first FPC board 110 as shown in FIG. 1. In this embodiment, the first coverlays 116 and 117 are further formed on the first flexible substrates 112 and 113 and the first patterned metal layers 114, so as to cover the first patterned metal layers 114 and to protect the first patterned metal layers 114 from the influence of oxidation or outside pollution. In this embodiment, a method of forming the first coverlay 116 is, for example, coating or dry film adhesion. A material of the first coverlay 116 includes polyimide and acrylic glue, such that the first coverlay 116 has adhesiveness and flexibility. It is noted that the present embodiment is merely for illustration purpose. The invention does not limit the material and type of the first coverlay 116 and the formation of the first FPC board 110. In other embodiments, the first FPC board 110 can also be a single-layer FPC board, or a multilayer FPC board formed by laminating two single-layer flexible boards together through an adhesive layer.

In this embodiment, the rigid-flex board structure 100 further includes a photo-imagable solder resist layer SR, which is disposed on the first patterned circuit layer 140 and the first substrate 120, and the photo-imagable solder resist layer SR exposes the first opening 122. In this embodiment, the photo-imagable solder resist layer SR can be a liquid photo-imagable (LPI) solder resist layer, and a part of the photo-imagable solder resist layer SR that covers the first opening 122 can be removed by a lithography process, so as to expose the first opening 122. In this embodiment, the photo-imagable solder resist layer SR also covers an outer surface (opposite the surface on which the first substrate 120 is disposed) of the first FPC board 110.

Figure 2:
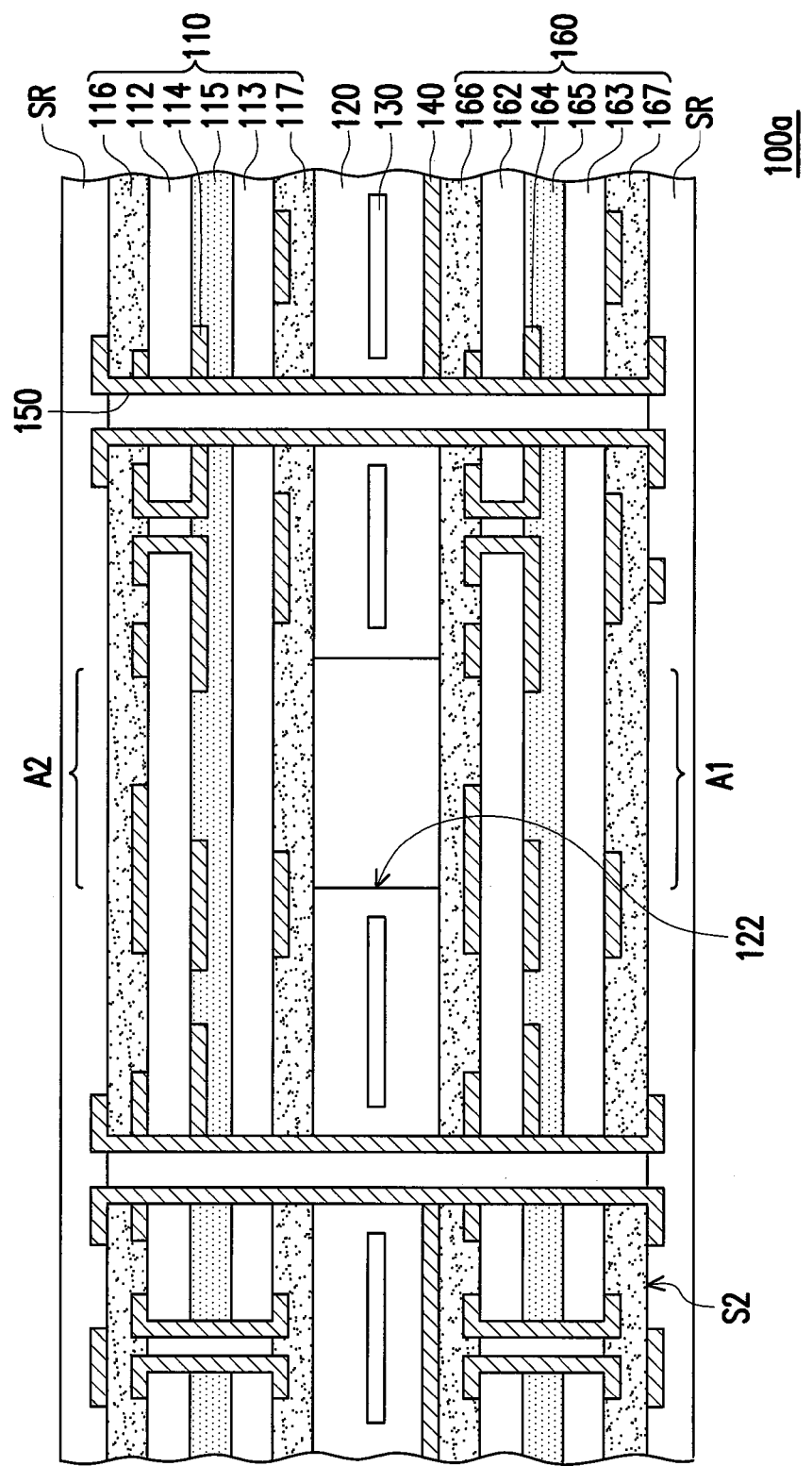
FIG. 2 is a schematic view of a rigid-flex board structure according to another embodiment of the invention.

FIG. 2 is a schematic view of a rigid-flex board structure according to another embodiment of the invention. It is noted that a rigid-flex board structure 100a of this embodiment is similar to the rigid-flex board structure 100 of FIG. 1. Therefore, the reference numerals of the previous embodiment and part of the content thereof apply to this embodiment, wherein the same reference numerals represent the same or similar elements and the same technical content is omitted from explanation. The descriptions of the omitted parts can be found in the previous embodiment and will not be repeated for this embodiment. Please refer to FIG. 2. The differences between the rigid-flex board structure 100a of this embodiment and the rigid-flex board structure 100 of FIG. 1 are explained below.

In this embodiment, the rigid-flex board structure 100a further includes a second FPC board 160, which includes a second exposing area A2 corresponding to the first exposing area A1. The first FPC board 110 and the second FPC board 160 are respectively disposed on two opposite surfaces of the first substrate 120, and the first opening 122 of the first substrate 120 exposes the second exposing area A2 of the second FPC board 160. The first FPC board 110 can be a single-layer FPC board or a multilayer FPC board.

In detail, the structure and the manufacturing method of the second FPC board 160 are approximately the same as those of the first FPC board 110. To be more specific, the second FPC board 160 includes at least one second flexible substrate 162 and 163, a plurality of second patterned metal layers 164, and at least one second coverlay 166 and 167, wherein the second patterned metal layers 164 are disposed on the second flexible substrate 162. In addition, the second coverlay 166 covers the second flexible substrate 162 and the second patterned metal layers 164. In this embodiment, the second FPC board 160 is a multilayer FPC board, which includes the second flexible substrates 162 and 163. The second patterned metal layers 164 are respectively disposed on the second flexible substrates 162 and 163 and are electrically connected to each other through the conductive vias. The second coverlays 166 and 167 cover the second flexible substrates 162 and 163 and the second patterned metal layers 164, so as to protect the second patterned metal layers 164 from the influence of oxidation or outside pollution. In this embodiment, a method of forming the second coverlay 166 is, for example, coating or dry film adhesion. A material of the second coverlay 166 includes polyimide and acrylic glue, such that the second coverlay 166 has adhesiveness and flexibility. It is noted that the present embodiment is merely for illustration purpose. The invention does not limit the material and type of the second coverlay 166, and does not limit the formation of the second FPC board 160. In other embodiments, the second FPC board 160 can also be a single-layer FPC board, or a multilayer FPC board formed by laminating two single-layer flexible boards together through an adhesive layer.

In this embodiment, the conductive vias 150 penetrate through the first FPC board 110, the second FPC board 160 and the first substrate 120, as shown in FIG. 2. In other embodiments, in the rigid-flex board structure 100a, the first FPC board 110 and the second FPC board 160 can be electrically connected to the first patterned circuit layer 140 through a plurality of conductive blind via holes and/or buried via holes. In this embodiment, the photo-imagable solder resist layer SR covers the outer surface of the first FPC board 110 and an outer surface of the second FPC board 160, respectively, as shown in FIG. 2. In this embodiment, the photo-imagable solder resist layer SR can be an LPI solder resist layer; however, the invention is not limited thereto.

Figure 3:
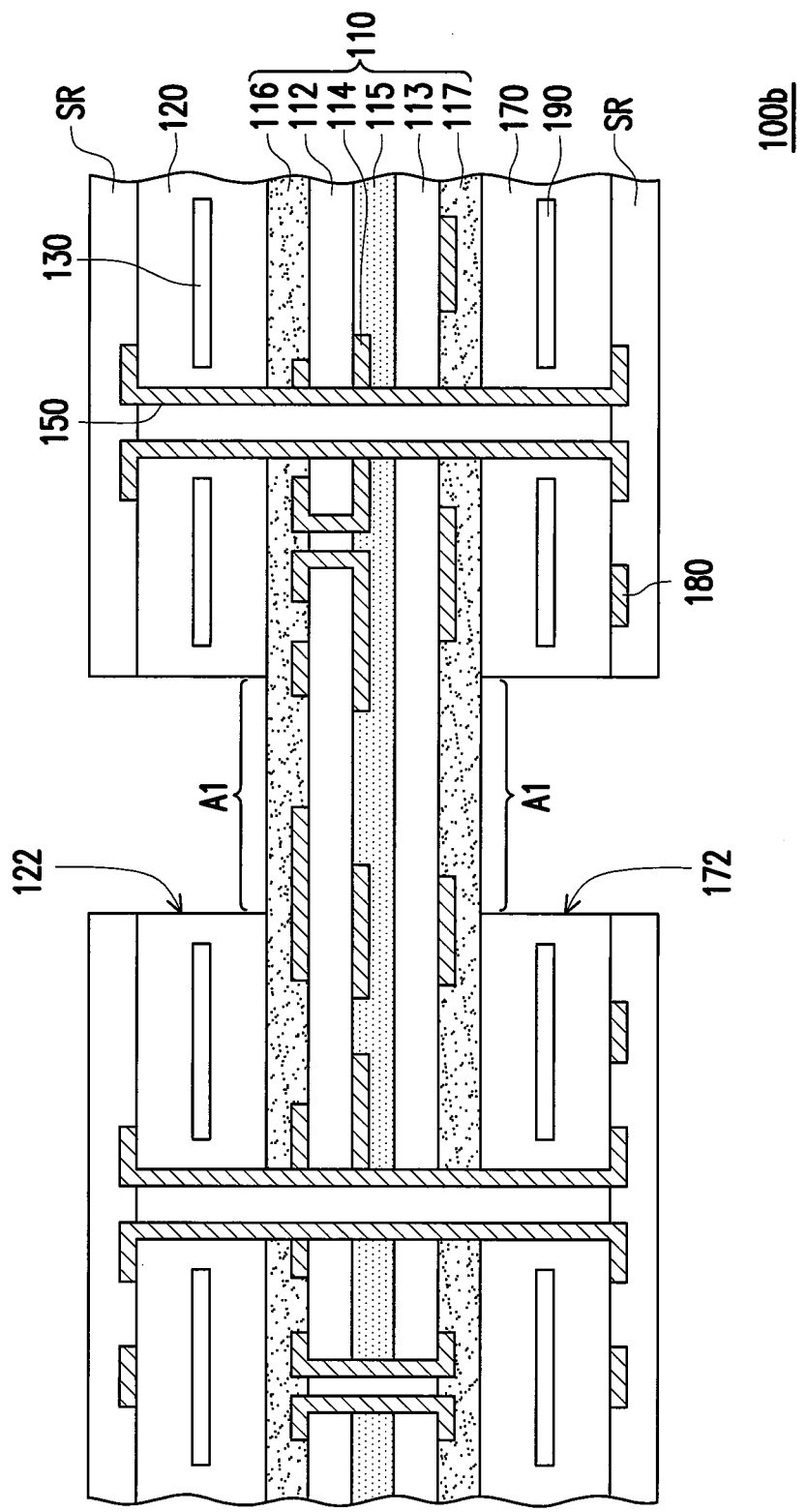
FIG. 3 is a schematic view of a rigid-flex board structure according to still another embodiment of the invention.

FIG. 3 is a schematic view of a rigid-flex board structure according to still another embodiment of the invention. It is noted that a rigid-flex board structure 100b of this embodiment is similar to the rigid-flex board structure 100 of FIG. 1. Therefore, the reference numerals of the previous embodiments and part of the content thereof apply to this embodiment, wherein the same reference numerals represent the same or similar elements and the same technical content is omitted from explanation. The descriptions of the omitted parts can be found in the previous embodiments and will not be repeated for this embodiment. Please refer to FIG. 3. The differences between the rigid-flex board structure 100b of this embodiment and the rigid-flex board structure 100 of FIG. 1 are explained below.

In this embodiment, the rigid-flex board structure 100b further includes a second substrate 170, a second patterned circuit layer 180 and a second reinforcing layer 190. The second substrate 170 includes a second opening 172 corresponding to the first opening 122. In this embodiment, the first FPC board 110 includes a plurality of the first exposing areas A1. The first substrate 120 and the second substrate 170 are respectively disposed on two opposite surfaces of the first FPC board 110, and the first opening 122 and the second opening 172 respectively expose the first exposing areas A1 located on the two opposite surfaces of the first FPC board 110. The conductive vias 150, for example, penetrate through the first substrate 120, the second substrate 170, and the first FPC board 110 so as to electrically connect the first patterned circuit layer 140 and the second patterned circuit layer 180 with the first FPC board 110.

In this embodiment, the second reinforcing layer 190 is embedded in the second substrate 170. In addition, a rigidity of a material of the second reinforcing layer 190 is substantially greater than a rigidity of a material of the second substrate 170. To be more specific, the material of the second reinforcing layer 190 is the same as the material of the first reinforcing layer 130 and is, for example, stainless steel, ceramic, or other materials having greater rigidity than that of glass fiber and/or prepreg, so as to improve structural strength of the second substrate 170 and to enhance flatness of the second substrate 170. The invention does not limit the material of the second reinforcing layer 190 as long as the rigidity of the material of the second reinforcing layer 190 is greater than that of glass fiber and/or prepreg.

In summary of the above, in the invention, the reinforcing layer is embedded in the substrate of the rigid board in the rigid-flex board structure. In addition, the rigidity of the material of the reinforcing layer is substantially greater than the rigidity of the material of the substrate. Under such configuration, since the reinforcing layer with greater rigidity is embedded in the substrate, structural strength of the substrate can be improved and flatness of the substrate can be enhanced. A bonding strength between the substrate and the FPC board can thus be improved, and reliability of the rigid-flex board structure can also be enhanced.

Though the invention has been disclosed by the embodiments as above, the embodiments are not intended to limit the invention. People having ordinary skills in the art, without exceeding the spirits and the scope of the invention, can make some changes and modifications. Therefore, the protected scope of the invention is defined by the attached claimed scope.

What is claimed is:

1. A rigid-flex board structure, comprising:
   a first flexible printed circuit (FPC) board, comprising at least one first exposing area;
   a first substrate, disposed on the first FPC board and comprising a first opening exposing the first exposing area;
   a first reinforcing layer, embedded in the first substrate, a rigidity of a material of the first reinforcing layer being substantially greater than a rigidity of a material of the first substrate;
   a first patterned circuit layer, disposed on the first substrate; and
   a plurality of conductive vias, configured to electrically connect the first patterned circuit layer and the first FPC board.

2. The rigid-flex board structure according to claim 1, wherein the first FPC board comprises at least one first flexible substrate and a plurality of first patterned metal layers, and the first patterned metal layers are disposed on the first flexible substrate.

3. The rigid-flex board structure according to claim 2, wherein the first FPC board further comprises a first coverlay (CVL), covering the first flexible substrate and the first patterned metal layers.

4. The rigid-flex board structure according to claim 2, wherein the first FPC board is a multilayer FPC board.

5. The rigid-flex board structure according to claim 1, wherein the material of the first reinforcing layer comprises stainless steel or ceramic.

6. The rigid-flex board structure according to claim 1, wherein the material of the first substrate comprises glass fiber or prepreg.

7. The rigid-flex board structure according to claim 1, further comprising a photo-imagable solder resist layer disposed on the first patterned circuit layer and the first substrate, and the photo-imagable solder resist layer exposing the first opening.

8. The rigid-flex board structure according to claim 1, wherein each of the conductive vias penetrates through the first FPC board and the first substrate.

9. The rigid-flex board structure according to claim 1, further comprising a second FPC board which comprises a second exposing area corresponding to the first exposing area, wherein the first FPC board and the second FPC board are respectively disposed on two opposite surfaces of the first substrate, and the first opening exposes the second exposing area.

10. The rigid-flex board structure according to claim 9, wherein each of the conductive vias penetrates through the first FPC board, the second FPC board and the first substrate.

11. The rigid-flex board structure according to claim 9, further comprising a plurality of photo-imagable solder resist layers, respectively covering outer surfaces of the first FPC board and the second FPC board.

12. The rigid-flex board structure according to claim 9, wherein the second FPC board is a multilayer FPC board.

13. The rigid-flex board structure according to claim 9, wherein the second FPC board comprises at least one second flexible substrate and a plurality of second patterned metal layers, and the second patterned metal layers are disposed on the second flexible substrate.

14. The rigid-flex board structure according to claim 12, wherein the second FPC board further comprises a second coverlay, covering the second flexible substrate and the second patterned metal layers.

15. The rigid-flex board structure according to claim 1, further comprising a second substrate and a second patterned circuit layer, wherein the second substrate comprises a second opening corresponding to the first opening, a number of the at least one first exposing area is plurality, the first substrate and the second substrate are respectively disposed on two opposite surfaces of the first FPC board, the first opening and the second opening respectively expose the first exposing areas, and the conductive vias electrically connect the second patterned circuit layer and the first FPC board.

16. The rigid-flex board structure according to claim 12, further comprising a second reinforcing layer embedded in the second substrate, a rigidity of a material of the second reinforcing layer being greater than a rigidity of a material of the second substrate.

* * * * *